US009041451B2

United States Patent
Papaefthymiou et al.

(10) Patent No.: US 9,041,451 B2
(45) Date of Patent: May 26, 2015

(54) RESONANT CLOCK DISTRIBUTION NETWORK ARCHITECTURE FOR TRACKING PARAMETER VARIATIONS IN CONVENTIONAL CLOCK DISTRIBUTION NETWORKS

(71) Applicant: Cyclos Semiconductor, Inc., Berkeley, CA (US)

(72) Inventors: Marios C. Papaefthymiou, Ann Arbor, MI (US); Alexander Ishii, Princeton, NJ (US)

(73) Assignee: Cyclos Semiconductor, Inc., Berkeley, CA (US)

( * ) Notice: Subject to any disclaimer, the term of this patent is extended or adjusted under 35 U.S.C. 154(b) by 0 days.

(21) Appl. No.: 13/714,369

(22) Filed: Dec. 13, 2012

(65) Prior Publication Data

US 2014/0015585 A1    Jan. 16, 2014

Related U.S. Application Data

(63) Continuation of application No. 12/903,188, filed on Oct. 12, 2010, now Pat. No. 8,358,163.

(60) Provisional application No. 61/250,830, filed on Oct. 12, 2009.

(51) Int. Cl.
*G06F 1/04* (2006.01)
*G06F 1/10* (2006.01)
(Continued)

(52) U.S. Cl.
CPC .. *G06F 1/04* (2013.01); *G06F 1/10* (2013.01); *H03K 5/05* (2013.01); *H03K 5/1565* (2013.01); *H03K 3/012* (2013.01); *H03K 5/00* (2013.01)

(58) Field of Classification Search
CPC ............ G06F 1/04; G06D 1/10; H03K 5/135; H03K 5/14
USPC .................................. 327/291, 293, 295–298
See application file for complete search history.

(56) References Cited

U.S. PATENT DOCUMENTS

| 4,611,135 A | 9/1986 | Nakayama et al. |
|---|---|---|
| 5,023,480 A | 6/1991 | Gieseke et al. |

(Continued)

FOREIGN PATENT DOCUMENTS

| EP | 0953892 | 11/1999 |
|---|---|---|
| EP | 1126612 | 8/2001 |

(Continued)

OTHER PUBLICATIONS

Athas et al., "Low-Power Digital Systems Based on Adiabatic-Switching Principles," IEEE Transactions on Very Large Scale Integration (VLSI) Systems, vol. 2, No. 4, pp. 398-407, Dec. 1994.

(Continued)

*Primary Examiner* — An Luu
(74) *Attorney, Agent, or Firm* — Sheppard, Mullin, Richter & Hampton LLP

(57) ABSTRACT

A resonant clock distribution network architecture is proposed that enables a resonant clock network to track the impact of parameter variations on the insertion delay of a conventional clock distribution network, thus limiting clock skew between the two networks and yielding increased performance. Such a network is generally applicable to semiconductor devices with various clock frequencies, and high-performance and low-power clocking requirements such as microprocessors, ASICs, and SOCs.

19 Claims, 8 Drawing Sheets

(51) Int. Cl.
*H03K 5/05* (2006.01)
*H03K 5/156* (2006.01)
*H03K 3/012* (2006.01)
*H03K 5/00* (2006.01)

(56) References Cited

U.S. PATENT DOCUMENTS

| | | |
|---|---|---|
| 5,036,217 A | 7/1991 | Rollins et al. |
| 5,111,072 A | 5/1992 | Seidel |
| 5,122,679 A | 6/1992 | Ishii et al. |
| 5,146,109 A | 9/1992 | Martignoni et al. |
| 5,311,071 A | 5/1994 | Ueda |
| 5,332,916 A | 7/1994 | Hirai |
| 5,384,493 A | 1/1995 | Furuki |
| 5,396,527 A | 3/1995 | Schlecht et al. |
| 5,410,491 A | 4/1995 | Minami |
| 5,430,408 A | 7/1995 | Ovens et al. |
| 5,473,526 A | 12/1995 | Svensson et al. |
| 5,473,571 A | 12/1995 | Shigematsu et al. |
| 5,489,866 A | 2/1996 | Diba |
| 5,504,441 A | 4/1996 | Sigal |
| 5,506,520 A | 4/1996 | Frank et al. |
| 5,506,528 A | 4/1996 | Cao et al. |
| 5,508,639 A | 4/1996 | Fattaruso |
| 5,517,145 A | 5/1996 | Frank |
| 5,517,399 A | 5/1996 | Yamauchi et al. |
| 5,526,319 A | 6/1996 | Dennard et al. |
| 5,537,067 A | 7/1996 | Carvajal et al. |
| 5,559,463 A | 9/1996 | Denker et al. |
| 5,559,478 A | 9/1996 | Athas et al. |
| 5,587,676 A | 12/1996 | Chowdhury |
| 5,675,263 A | 10/1997 | Gabara |
| 5,701,093 A | 12/1997 | Suzuki |
| 5,734,285 A | 3/1998 | Harvey |
| 5,760,620 A | 6/1998 | Doluca |
| 5,838,203 A | 11/1998 | Stamoulis et al. |
| 5,841,299 A | 11/1998 | De |
| 5,872,489 A | 2/1999 | Chang et al. |
| 5,892,387 A | 4/1999 | Shigehara et al. |
| 5,896,054 A | 4/1999 | Gonzalez |
| 5,970,074 A | 10/1999 | Ehiro |
| 5,986,476 A | 11/1999 | De |
| 5,999,025 A | 12/1999 | New |
| 6,009,021 A | 12/1999 | Kioi |
| 6,009,531 A | 12/1999 | Selvidge et al. |
| 6,011,441 A | 1/2000 | Ghoshal |
| 6,037,816 A | 3/2000 | Yamauchi |
| 6,052,019 A | 4/2000 | Kwong |
| 6,069,495 A | 5/2000 | Ciccone et al. |
| 6,091,629 A | 7/2000 | Osada et al. |
| 6,150,865 A | 11/2000 | Fluxman et al. |
| 6,160,422 A | 12/2000 | Huang |
| 6,169,443 B1 | 1/2001 | Shigehara et al. |
| 6,177,819 B1 | 1/2001 | Nguyen |
| 6,230,300 B1 | 5/2001 | Takano |
| 6,242,951 B1 | 6/2001 | Nakata et al. |
| 6,278,308 B1 | 8/2001 | Partovi et al. |
| 6,323,701 B1 | 11/2001 | Gradinariu et al. |
| RE37,552 E | 2/2002 | Svensson et al. |
| 6,433,586 B2 | 8/2002 | Ooishi |
| 6,438,422 B1 | 8/2002 | Schu et al. |
| 6,477,658 B1 | 11/2002 | Pang |
| 6,538,346 B2 | 3/2003 | Pidutti et al. |
| 6,542,002 B2 | 4/2003 | Jang et al. |
| 6,559,681 B1 | 5/2003 | Wu et al. |
| 6,563,362 B2 | 5/2003 | Lambert |
| 6,608,512 B2 | 8/2003 | Ta et al. |
| 6,720,815 B2 | 4/2004 | Mizuno |
| 6,742,132 B2 | 5/2004 | Ziesler et al. |
| 6,777,992 B2 | 8/2004 | Ziesler et al. |
| 6,856,171 B1 | 2/2005 | Zhang |
| 6,879,190 B2 | 4/2005 | Kim et al. |
| 6,882,182 B1 | 4/2005 | Conn et al. |
| 7,005,893 B1 | 2/2006 | Athas et al. |
| 7,145,408 B2 | 12/2006 | Shepard et al. |
| 7,215,188 B2 | 5/2007 | Ramaraju et al. |
| 7,227,425 B2 | 6/2007 | Jang et al. |
| 7,233,186 B2 | 6/2007 | Ishimi |
| 7,301,385 B2 | 11/2007 | Takano et al. |
| 7,307,486 B2 | 12/2007 | Pernia et al. |
| 7,355,454 B2 | 4/2008 | Papaefthymiou et al. |
| 7,567,110 B2 | 7/2009 | Shionoya |
| 7,622,977 B2 | 11/2009 | Papaefthymiou et al. |
| 7,696,734 B2 | 4/2010 | Endo et al. |
| 7,719,316 B2 | 5/2010 | Chueh et al. |
| 7,719,317 B2 | 5/2010 | Chueh et al. |
| 7,956,664 B2 | 6/2011 | Chueh et al. |
| 7,973,565 B2 | 7/2011 | Ishii et al. |
| 8,089,323 B2 | 1/2012 | Tarng et al. |
| 8,237,484 B2 | 8/2012 | Kaviani et al. |
| 8,350,632 B1 | 1/2013 | Kim |
| 8,362,811 B2 | 1/2013 | Papaefthymiou et al. |
| 2001/0013795 A1 | 8/2001 | Nojiri |
| 2002/0140487 A1 | 10/2002 | Fayneh et al. |
| 2003/0189451 A1 | 10/2003 | Ziesler et al. |
| 2005/0057286 A1 | 3/2005 | Shepard et al. |
| 2005/0088231 A1 | 4/2005 | Ziegler |
| 2005/0114820 A1 | 5/2005 | Restle |
| 2006/0022713 A1 | 2/2006 | Tokuhiro et al. |
| 2006/0082387 A1 | 4/2006 | Papaefthymiou et al. |
| 2006/0152293 A1 | 7/2006 | McCorquodale et al. |
| 2007/0096957 A1 | 5/2007 | Papaefthymiou et al. |
| 2007/0168786 A1 | 7/2007 | Drake et al. |
| 2007/0216462 A1 | 9/2007 | Ishimi |
| 2008/0136479 A1 | 6/2008 | You et al. |
| 2008/0150605 A1 | 6/2008 | Chueh et al. |
| 2008/0150606 A1 | 6/2008 | Kumata |
| 2008/0164921 A1 | 7/2008 | Shin |
| 2008/0303576 A1 | 12/2008 | Chueh et al. |
| 2009/0027085 A1 | 1/2009 | Ishii et al. |
| 2011/0084736 A1 | 4/2011 | Papaefthymiou et al. |
| 2011/0084772 A1 | 4/2011 | Papaefthymiou et al. |
| 2011/0084773 A1 | 4/2011 | Papaefthymiou et al. |
| 2011/0084774 A1 | 4/2011 | Papaefthymiou et al. |
| 2011/0084775 A1 | 4/2011 | Papaefthymiou et al. |
| 2011/0090018 A1 | 4/2011 | Papaefthymiou et al. |
| 2011/0090019 A1 | 4/2011 | Papaefthymiou et al. |
| 2011/0109361 A1 | 5/2011 | Nishio |
| 2011/0140753 A1 | 6/2011 | Papaefthymiou et al. |
| 2011/0210761 A1 | 9/2011 | Ishii et al. |
| 2011/0215854 A1 | 9/2011 | Chueh et al. |
| 2013/0229189 A1 | 9/2013 | Pang et al. |

FOREIGN PATENT DOCUMENTS

| | | |
|---|---|---|
| EP | 1764669 | 3/2007 |
| JP | 63246865 | 10/1988 |
| JP | H07154228 | 6/1995 |
| JP | 7321640 | 12/1995 |
| JP | H1197627 | 4/1999 |
| JP | 3756285 | 1/2006 |
| JP | 2009022029 | 1/2009 |
| WO | 2005092042 | 10/2005 |
| WO | 2008148044 | 12/2008 |

OTHER PUBLICATIONS

Chan et al., "1.1 to 1.6GHz Distributed Differential Oscillator Global Clock Network," International Solid-State Circuits Conference, pp. 518-519, Feb. 9, 2005.

Chan et al., "A 4.6GHz Resonant Global Clock Distribution Network," IEEE International Solid-State Circuits Conference, Feb. 18, 2004.

Chan et al., "A Resonant Global Clock Distribution for the Cell Broadband Engine Processor," IEEE Journal of Solid State Circuits, vol. 44, No. 1, pp. 64-72, Jan. 2009.

Chan et al., "Design of Resonant Global Clock Distributions," Proceedings of the 21st International Conference on Computer Design, pp. 248-253, Oct. 2003.

Chueh et al., "900MHz to 1.2GHz Two-Phase Resonant Clock Network with Programmable Driver and Loading," IEEE Custom Integrated Circuits Conference, pp. 777-780, Sep. 2006.

(56) References Cited

OTHER PUBLICATIONS

Chueh et al., "Two-Phase Resonant Clock Distribution," Proceedings of the IEEE Computer Society Annual Symposium on VLSI: New Frontiers in VLSI Design, May 2005.

Cooke et al., "Energy Recovery Clocking Scheme and Flip-Flops for Ultra Low-Energy Application," International Symposium on Low-Power Electronic Design, pp. 54-59, Aug. 25-27, 2003.

Drake et al., "Resonant Clocking Using Distributed Parasitic Capacitance," IEEE Journal of Solid-State Circuits, vol. 39, No. 9, pp. 1520-1528, Sep. 2004.

Dunning, Jim, "An All-Digital Phase-Locked Loop with 50-Cycle Lock Time Suitable for High-Performance Microprocessors," IEEE Journal of Solid-State Circuits, vol. 30, No. 4, pp. 412-422, Apr. 1995.

Fang et al., "A High-Performance Asynchronous FPGA: Test Results," Proceedings of the 13th Annual IEEE Symposium on Field-Programmable Custom Computing Machines, Apr. 2005.

Favalli et al., "Testing Scheme for IC's Clocks," IEEE European Design and Test Conference, Mar. 1997.

Gutnik et al., "Active GHz Clock Network Using Distributed PLLs," IEEE Journal of Solid-State Circuits, vol. 35, No. 11, pp. 1553-1560, Nov. 2000.

Ishii et al., "A Resonant-Clock 200MHz ARM926EJ-S(TM) Microcontroller," European Solid-State Circuits Conference, Sep. 2009.

Kim et al., "Energy Recovering Static Memory," Proceedings of the 2002 International Symposium on Low Power Electronics and Design, pp. 92-97, Aug. 12-14, 2002.

Maksimovic et al., "Design and Experimental Verification of a CMOS Adiabatic Logic with Single-Phase Power-Clock Supply," Proceedings of the 40th Midwest Symposium on Circuits and Systems, pp. 417-420, Aug. 1997.

Maksimovic et al., "Integrated Power Clock Generators for Low Energy Logic," IEEE Annual Power Electronics Specialists Conference, vol. 1, pp. 61-67, Jun. 18-22, 1995.

Moon et al., "An Efficient Charge Recovery Logic Circuit," IEEE Journal of Solid-State Circuits, vol. 31, No. 4, pp. 514-522, Apr. 1996.

Sathe et al., "A 0.8-1.2GHz Frequency Tunable Single-Phase Resonant-Clocked FIR Filter with Level-Sensitive Latches," IEEE 2007 Custom Integrated Circuits Conference, pp. 583-586, Sep. 2007.

Sathe et al., "A 1.1GHz Charge-Recovery Logic," IEEE International Solid-State Circuits Conference, Feb. 7, 2006.

Sathe et al., "A 1GHz FIR Filter with Distributed Resonant Clock Generator," IEEE Symposium on VLSI Circuits, pp. 44-45, Jun. 2007.

Sathe et al., "Resonant-Clock Latch-Based Design," IEEE Journal of Solid-State Circuits, vol. 43, No. 4, pp. 864-873, Apr. 2008.

Taskin, Baris et al., "Timing-Driven Physical Design for VLSI Circuits Using Resonant Rotary Clocking," 49th IEEE International Midwest Symposium on Circuits and Systems, pp. 261-265, Aug. 6, 2006.

Teifel et al., "Highly Pipelined Asynchronous FPGAs," Proceedings of the 2004 ACM/SIGDA 12th International Symposium on Field Programmable Gate Arrays, pp. 133-142, Feb. 22-24, 2004.

Weste et al., "Principles of CMOS VLSI Design: A Systems Perspective," 2nd Edition, Addison-Wesley, pp. 9-11, 1992.

Ziesler et al., "A 225 MHz Resonant Clocked ASIC Chip," Proceedings of the 2003 International Symposium on Low Power Electronics and Design, pp. 48-53, Aug. 25-27, 2003.

Ziesler et al., "A Resonant Clock Generator for Single-Phase Adiabatic Systems," Proceedings of the 2001 International Symposium on Low Power Electronics and Design, pp. 159-164, Aug. 6-7, 2001.

Ziesler et al., "Energy Recovering ASIC Design," Proceedings of the IEEE Computer Society Annual Symposium on VLSI, Feb. 20-21, 2003.

Search Report and Written Opinion from International Serial No. PCT/US2007/086304 mailed Mar. 3, 2009.

Search Report and Written Opinion from International Serial No. PCT/US2008/064766 mailed Dec. 22, 2008.

Search Report and Written Opinion from International Serial No. PCT/US2010/052390 mailed Jun. 23, 2011.

Search Report and Written Opinion from International Serial No. PCT/US2010/052393 mailed Jun. 23, 2011.

Search Report and Written Opinion from International Serial No. PCT/US2010/052395 mailed Jun. 23, 2011.

Search Report and Written Opinion from International Serial No. PCT/US2010/052396 mailed Jun. 23, 2011.

Search Report and Written Opinion from International Serial No. PCT/US2010/052397 mailed Jun. 23, 2011.

Search Report and Written Opinion from International Serial No. PCT/US2010/052401 mailed Jun. 29, 2011.

Search Report and Written Opinion from International Serial No. PCT/US2010/052402 mailed Jun. 23, 2011.

Search Report and Written Opinion from International Serial No. PCT/US2010/052405 mailed Jun. 23, 2011.

Search Report from International Serial No. PCT/US2003/010320 mailed Sep. 29, 2003.

Supplementary European Search Report from European Serial No. 03716979.4 mailed Jun. 7, 2006.

Shigematsu, Satoshi et al., "A 1-V High-Speed MTCMOS Circuit Scheme for Power-Down Application Circuits," IEEE Journal of Solid-State Circuits, vol. 32, No. 6, pp. 861-869, Jun. 1997.

Examination Report from European Patent Application No. 08756240.1 mailed Oct. 17, 2014.

RESONANT CLOCK DISTRIBUTION NETWORK ARCHITECTURE FOR TRACKING PARAMETER VARIATIONS IN CONVENTIONAL CLOCK DISTRIBUTION NETWORKS

CLAIM OF PRIORITY AND RELATED APPLICATIONS

This patent application is a continuation of and claims priority to U.S. patent application Ser. No. 12/903,188, entitled RESONANT CLOCK DISTRIBUTION NETWORK ARCHITECTURE FOR TRACKING PARAMETER VARIATIONS IN CONVENTIONAL CLOCK DISTRIBUTION NETWORKS, filed Oct. 12, 2010, which claims priority to U.S. Provisional Patent Application No. 61/250,830, entitled SYSTEMS AND METHODS FOR RESONANT CLOCKING INTEGRATED CIRCUITS, filed Oct. 12, 2009, both of which are incorporated herein. This patent application is related to the technologies described in the following patents and applications, all of which are incorporated herein:

U.S. patent application Ser. No. 12/125,009, entitled RESONANT CLOCK AND INTERCONNECT ARCHITECTURE FOR DIGITAL DEVICES WITH MULTIPLE CLOCK NETWORKS, filed Oct. 12, 2009, which claims priority to U.S. Provisional Patent Application No. 60/931,582, entitled RESONANT CLOCK AND INTERCONNECT ARCHITECTURE FOR PROGRAMMABLE LOGIC DEVICES, filed May 23, 2007;

U.S. patent application Ser. No. 12/903,154, entitled RESONANT CLOCK DISTRIBUTION NETWORK ARCHITECTURE WITH PROGRAMMABLE DRIVERS, filed Oct. 12, 2010;

U.S. patent application Ser. No. 12/903,158, entitled ARCHITECTURE FOR CONTROLLING CLOCK CHARACTERISTICS, filed Oct. 12, 2010;

U.S. patent application Ser. No. 12/903,163, entitled METHOD FOR SELECTING NATURAL FREQUENCY IN RESONANT CLOCK DISTRIBUTION NETWORKS WITH NO INDUCTOR OVERHEAD, filed Oct. 12, 2010;

U.S. patent application Ser. No. 12/903,166, entitled ARCHITECTURE FOR ADJUSTING NATURAL FREQUENCY IN RESONANT CLOCK DISTRIBUTION NETWORKS, filed Oct. 12, 2010;

U.S. patent application Ser. No. 12/903,168, entitled ARCHITECTURE FOR FREQUENCY-SCALED OPERATION IN RESONANT CLOCK DISTRIBUTION NETWORKS, filed Oct. 12, 2010;

U.S. patent application Ser. No. 12/903,172, entitled ARCHITECTURE FOR SINGLE-STEPPING IN RESONANT CLOCK DISTRIBUTION NETWORKS, filed Oct. 12, 2010; and U.S. patent application Ser. No. 12/903,174, entitled ARCHITECTURE FOR OPERATING RESONANT CLOCK NETWORK IN CONVENTIONAL MODE filed Oct. 12, 2010.

FIELD OF INVENTION

This disclosure relates generally to clock distribution network architectures for digital devices with multiple clock networks and various clock frequencies such as microprocessors, application-specific integrated circuits (ASICs), and System-on-a-Chip (SOC) devices.

BACKGROUND OF THE INVENTION

Resonant clock distribution networks have recently been proposed for the energy-efficient distribution of clock signals in synchronous digital systems. In these networks, energy-efficient operation is achieved using one or more inductors to resonate the parasitic capacitance of the clock distribution network. Clock distribution with extremely low jitter is achieved through reduction in the number of clock buffers. Moreover, extremely low skew is achieved among the distributed clock signals through the design of relatively symmetric all-metal distribution networks. Overall network performance depends on operating speed and total network inductance, resistance, size, and topology, with lower-resistance symmetric networks resulting in lower jitter, skew, and energy consumption when designed with adequate inductance.

Without the inductive elements of resonant clock distribution networks, conventional (i.e., non-resonant) clock distribution networks, rely almost exclusively on collections of buffers for distributing a reference clock signal to the multiple clocked elements, such as flip-flops and clock gaters, of a semiconductor device. In conventional clock distribution networks, the buffers are generally arranged in a topology that allows the reference clock signal to be supplied at a single root-point of the network and then propagated throughout the device through a sequence of buffer elements. The total propagation delays of the buffers along any given path from the root to some clocked element are generally balanced in some fashion, so that, for example, the clock signal arrives at all the various elements at approximately the same time. The propagation delays of individual buffers depend on a variety of factors, including the sizes of the transistors used to implement the buffers, the capacitive loads associated with the wiring used to interconnect the different buffers in the network, the temperature and voltage the buffers are operated at, and the specific characteristics of the various device materials that are actually realized during the manufacturing process.

The total propagation delay of the buffers along any given path from the root to some clocked element is also referred to as the insertion delay of the path, and the overall insertion delay profile of the overall clock network is one of the network's most important characteristics. The worst-case difference between the insertion delays of any two clocked elements in a semiconductor design is referred to as the clock skew between the devices. In general, increased clock skew is a hindrance to overall device performance, as large skews imply that new outputs of clocked-elements may become available later than anticipated, and inputs to clocked-elements may be needed earlier than anticipated, leading to an overall reduction in the amount of time that is available for the operation of the digital logic during each clock period.

As previously alluded to, variations in manufacturing parameters or operating conditions affect buffer propagation delays, and hence, the insertion delays of both paths and the overall clock distribution network. For example, process variations during manufacturing can result in faster or slower transistor switches, thus resulting in shorter or longer insertion delays, respectively. Furthermore, variations in the supply voltage or temperature during operation can affect insertion delays. To exacerbate the situation, these variations are "dynamic" in the sense that even a specific sample of a device will in the field be subject to voltages and temperatures that will vary from one instant to the next. These dynamic variations increase delay uncertainty, and subsequently reduce the level of performance that a device can be guaranteed to achieve under all anticipated operating conditions. In general, the magnitude of insertion delay variations is proportional to their target values. Therefore, clock distribution networks with relatively long insertion delays tend to have wider variations in their insertion delays than clock distribution networks with relatively short insertion delays.

In resonant clock distribution networks, insertion delays are typically in the order of a few tens of picoseconds, as these networks tend to have very low resistance, and tend to include only a few buffers. By contrast, conventional clock distribution networks typically include a large number of buffers and can exhibit insertion delays in the order of hundreds of picoseconds. Consequently, in the presence of variations in process parameters, voltage, and temperature, conventional clock distributions networks tend to have a relatively larger variation in insertion delay than resonant clock networks.

When resonant and conventional clock distribution networks are used in the same design, the difference in the insertion delays of the two networks can result in relatively large clock skews that can be detrimental to overall device performance. Typically, in such a design, it is possible to use automatic delay tuning blocks to compensate for the difference in the insertion delays of the two clock distribution networks, but due to the increased variability of advanced manufacturing processes, the range of insertion-delay mismatches can be significant, even to the point of being comparable to the longest insertion delays in the conventional clock distribution network. The overheads of automatic delay tuning blocks with such large tuning ranges can thus be significant, and even the design of a delay tuning block with such a large tuning range can be particularly challenging.

Another challenge with designs that include resonant and conventional clock distribution networks is the rate of variation in the clock skew between the two networks in the presence of dynamic variations during operation. Such variations may affect insertion delay within a clock cycle of operation. Moreover, their impact may vary significantly from cycle to cycle. Automatic delay tuning blocks are typically unable to react to such quick changes. Therefore, if the changes in the insertion delay of the resonant clock does not track the changes in the insertion delay of the conventional network, this difference is manifested as additional delay uncertainty that has a detrimental impact on overall device performance.

Architectures for resonant clock distribution networks have been described and empirically evaluated in the several articles, including: "A 225 MHz Resonant Clocked ASIC Chip," by Ziesler C., et al., International Symposium on Low-Power Electronic Design, August 2003; "Energy Recovery Clocking Scheme and Flip-Flops for Ultra_Low-Energy Applications," by Cooke, M., et al., International Symposium on Low-Power Electronic Design, August 2003; "Resonant Clocking Using Distributed Parasitic Capacitance," by Drake, A., et al., Journal of Solid-State Circuits, Vol. 39, No. 9, September 2004; "A 1.1 GHz Charge Recovery Logic," by Sathe V., et al., International Solid-State Circuits Conference, February 2006; "900 MHz to 1.2 GHz two-phase resonant clock network with programmable driver and loading," by Chueh J.-Y., et al., IEEE 2006 Custom Integrated Circuits Conference, September 2006; "A 0.8-1.2 GHz frequency tunable single-phase resonant-clocked FIR filter," by Sathe V., et al., IEEE 2007 Custom Integrated Circuits Conference, September 2007; and "A Resonant Global Clock Distribution for the Cell Broadband Engine Processor," by Chan S., et al., IEEE Journal of Solid State Circuits, Vol. 44, No. 1, January 2009. None of these articles describes any methods for using resonant and conventional clock distribution networks in the same design.

A design with resonant and conventional clock distribution networks was described in "A Resonant-Clock 200 MHz ARM926EJ-S Microcontroller," by Ishii A., et al., European Solid-State Circuits Conference, September 2009. The design in that article used a programmable delay block to adjust the insertion delay of the reference clock that drives the resonant clock driver. That delay block was programmed by control signals external to the chip. Therefore, in that design, the resonant clock network was not capable of tracking the conventional clock distribution network in the presence of dynamic variations.

Methods for controlling the skew between a resonant clock network and a second clock network are described in US Pat. Appl. No. 20080150605 by Chueh J.-Y., et al. Those approaches rely on the use of digitally-controlled delay blocks to automatically adjust the delays of the reference clocks by monitoring the skew between clock signals in the two clock networks. This monitoring is performed over time using an integration function. It is thus unsuitable for providing quick adjustments on a cycle-by-cycle basis.

Overall, the examples herein of some prior or related systems and their associated limitations are intended to be illustrative and not exclusive. Other limitations of existing or prior systems will become apparent to those of skill in the art upon reading the following Detailed Description.

SUMMARY OF THE DESCRIPTION

A resonant clock distribution network architecture is proposed that enables a resonant clock network to track the impact of parameter variations on the insertion delay of a conventional clock distribution network, thus limiting clock skew between the two networks and yielding increased performance. Such a network is generally applicable to semiconductor devices with various clock frequencies, and high-performance and low-power clocking requirements such as microprocessors, ASICs, and SOCs.

Disclosed herein is a clock distribution network, comprising: a conventional clock distribution network including a plurality of buffers configured to propagate a reference clock signal; a resonant clock distribution network including a resonant clock driver having a drive element electrically coupled to a clock node of the resonant clock driver, the drive element configured to receive and propagate a reference clock signal, a programmable delay electrically coupled between a reference clock input and the drive element; and a buffer network electrically coupled between the reference clock input to the resonant clock distribution network and the drive element of the resonant clock driver, wherein the buffer network mirrors a topology and loading of a sub-network of the conventional clock distribution network.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other advantages and features will become apparent from the following description and claims. It should be understood that the description and specific examples are intended for purposes of illustration only and not intended to limit the scope of the present disclosure.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

Figure 1:
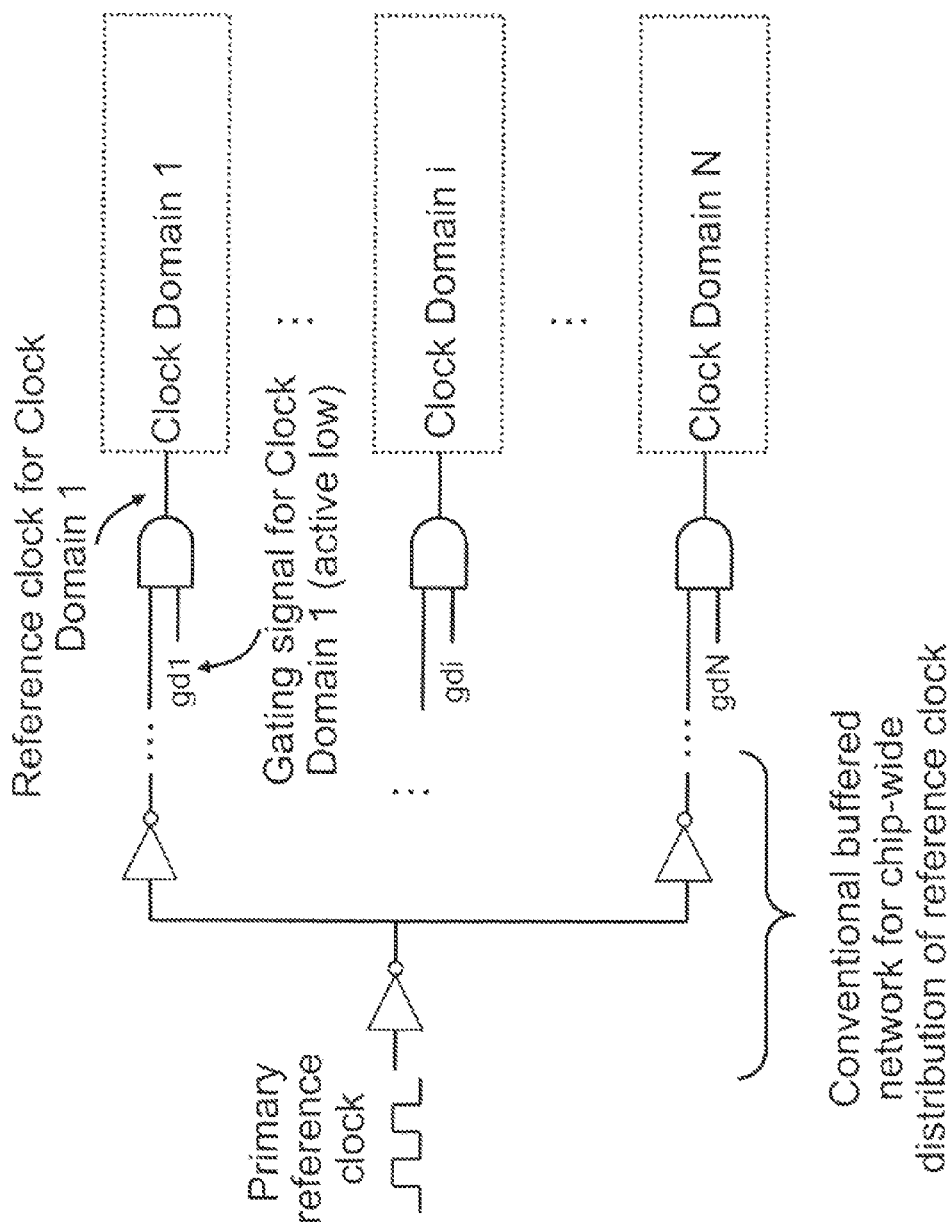
FIG. 1 shows a typical chip-wide clock distribution network architecture with multiple clock domains.

The headings provided herein are for convenience only and do not necessarily affect the scope or meaning of the claimed invention.

In the drawings, the same reference numbers and any acronyms identify elements or acts with the same or similar structure or functionality for ease of understanding and convenience.

DETAILED DESCRIPTION OF THE INVENTION

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

FIG. 1 shows a typical clock distribution network architecture for a semiconductor device. This network comprises multiple clock domains. Each clock domain i receives a reference clock signal. For each clock domain i, a gating signal gdi can be used to selectively enable the propagation of the reference clock signal within clock domain i. While FIG. 1 shows a single primary reference clock, buffered copies of which are distributed to each of the clock domains, in general, multiple distinct reference clock signals can be propagated to the clock domains, each using a dedicated buffered clock distribution network. Each clock domain receives one of these multiple reference clock signals. These multiple reference clock signals may or may not be synchronized to each other, may be operating at different frequencies, and their frequencies may change over time.

Figure 2:
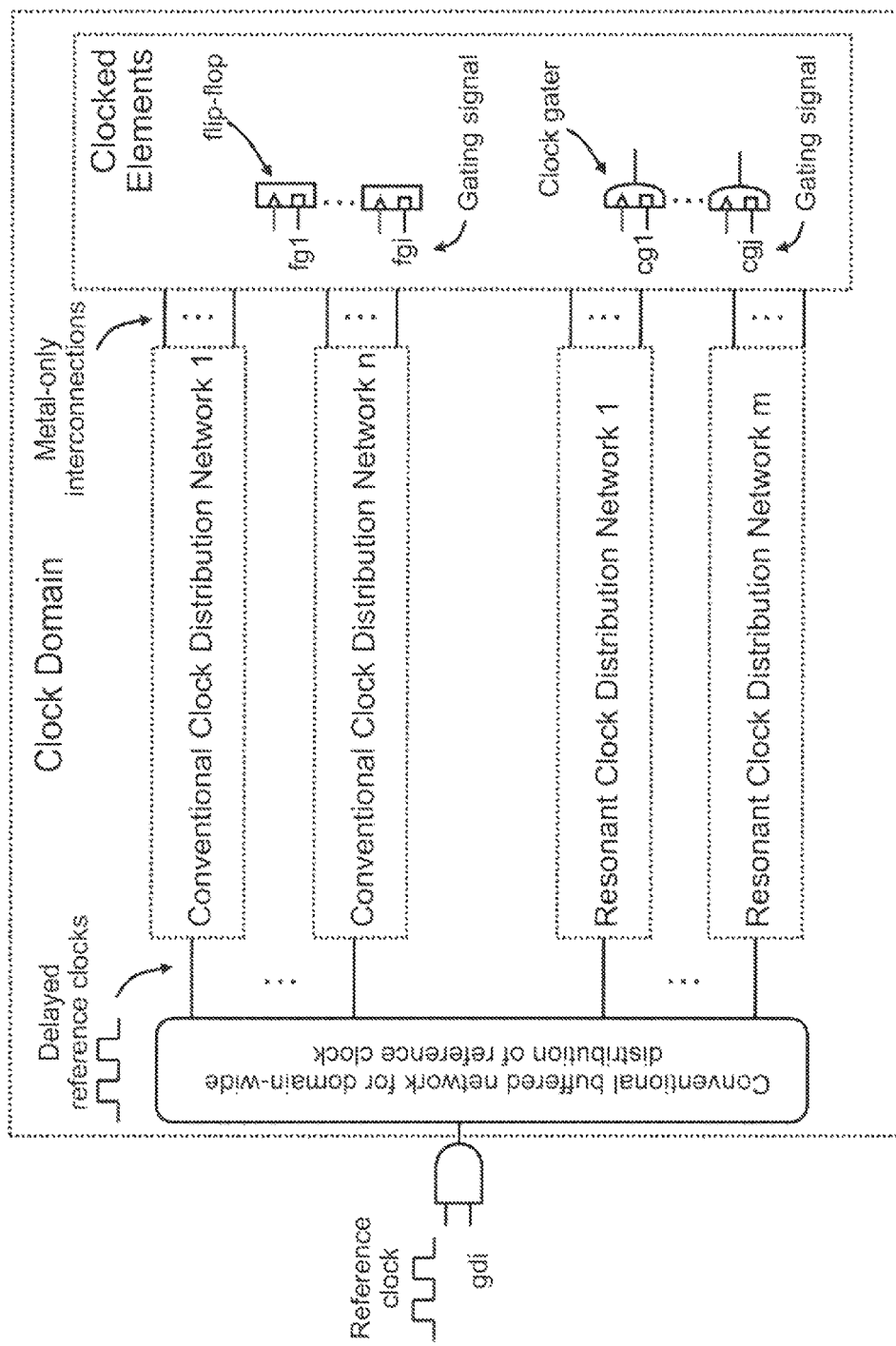
FIG. 2 shows a typical clock distribution network architecture within a clock domain.

FIG. 2 shows a typical clock distribution network architecture within a clock domain, that incorporates both conventional clock distribution networks and resonant clock distribution networks. Using a combination of conventional distribution networks and resonant clock distribution networks, the gated reference clock is distributed to multiple clocked elements such as flip-flops and clock gaters. The flip-flops are storage elements that update their contents according to their data inputs and in synchrony with their clock inputs. Each flip-flop fi may use a gating signal fgi to selectively enable the update of their contents. Each clock gater cj uses a gating signal cgj to selectively enable the further propagation of the clock signal to other clocked elements.

Figure 3:
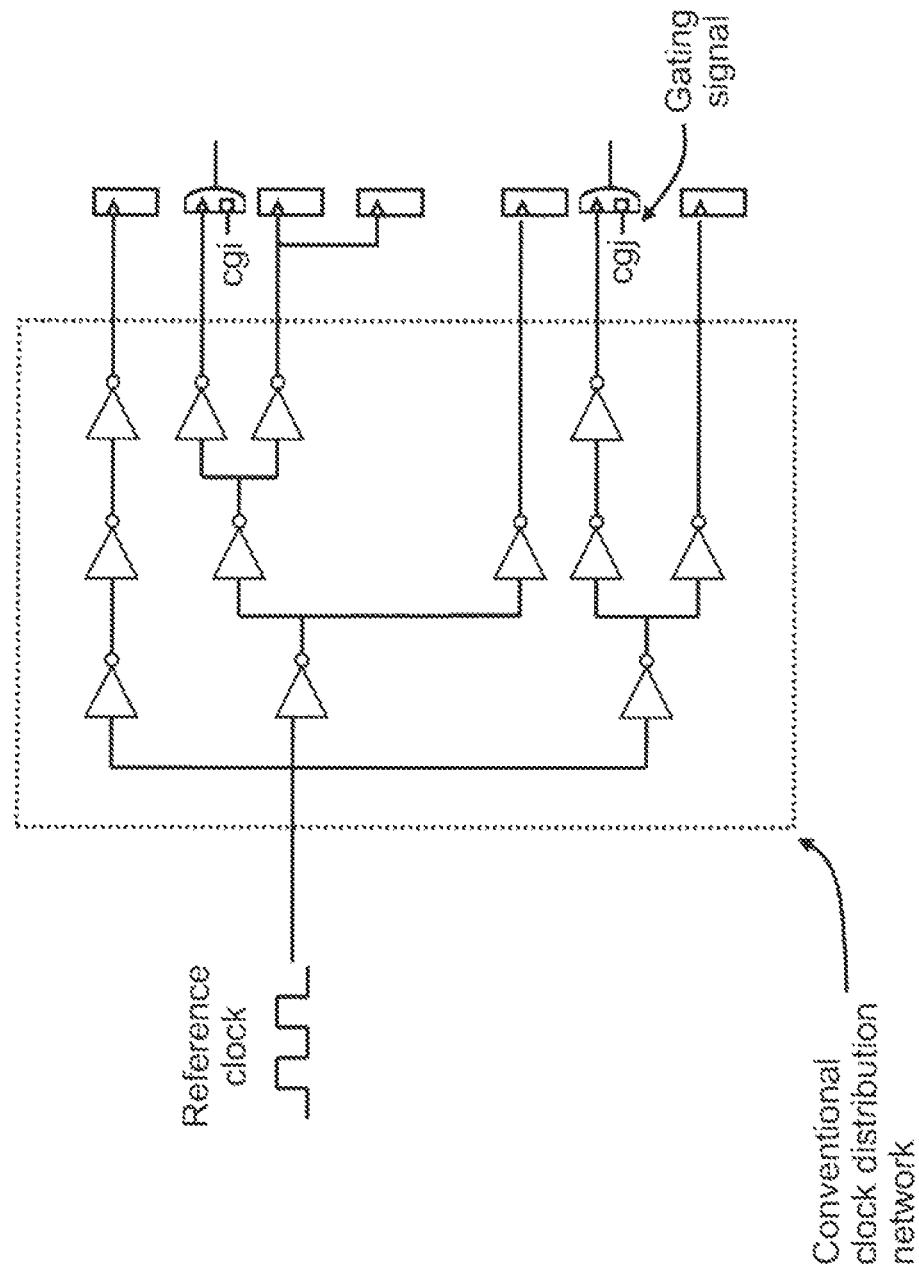
FIG. 3 shows a typical conventional clock distribution network.

FIG. 3 shows a conventional network for distributing a reference clock signal to multiple clocked elements such as flip-flops and clock gaters. In this network, a collection of buffers is used to propagate a reference clock signal that is supplied at the root of the network to multiple clocked elements throughout a semiconductor device. The propagation delays of the paths from the root to the clocked elements are generally balanced, for example, so that the clock signal arrives at all these elements at approximately the same time.

Figure 4:
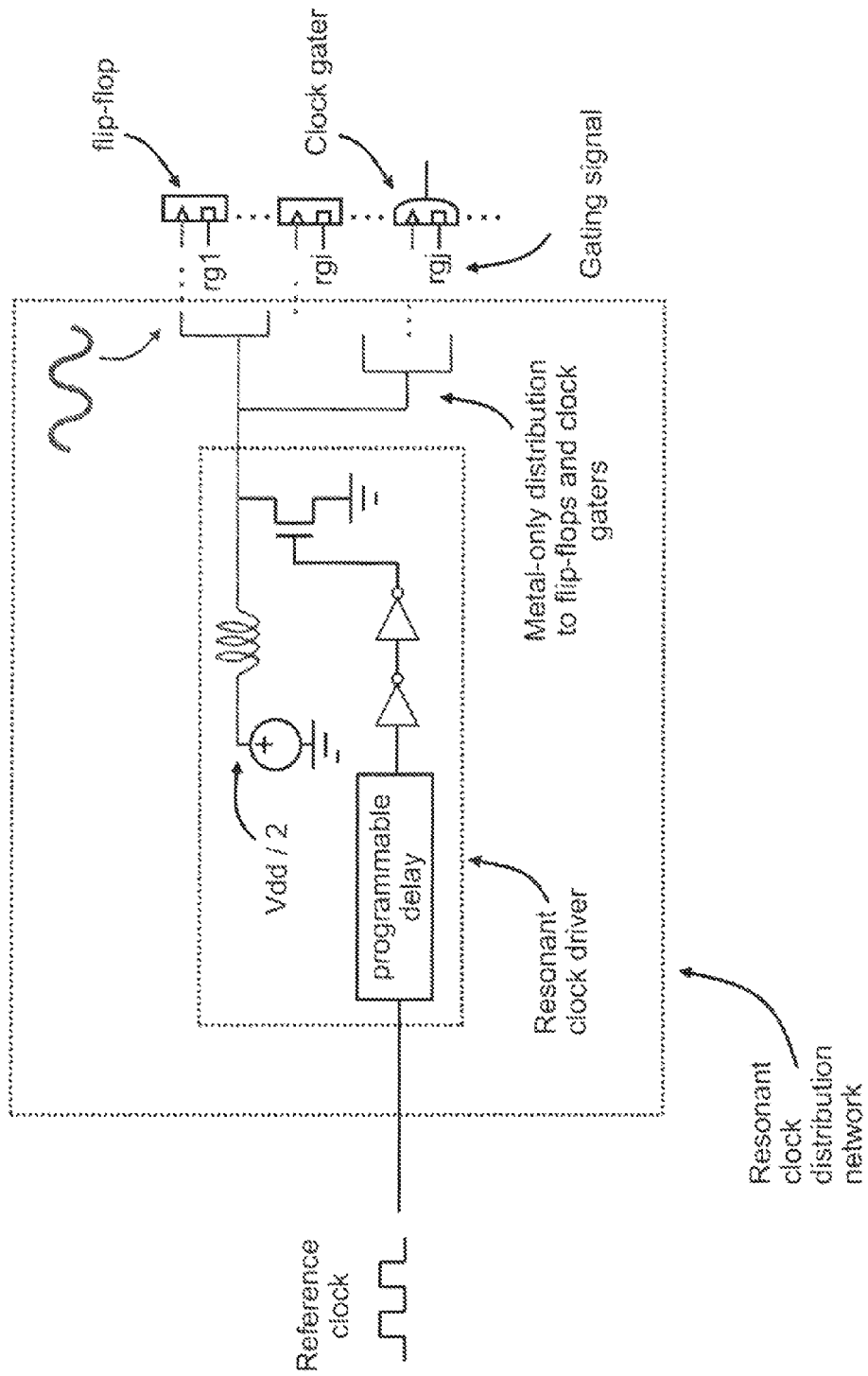
FIG. 4 shows a canonical resonant clock distribution network and resonant clock driver.

FIG. 4 shows a resonant clock distribution network for distributing a reference clock signal to multiple clocked elements such as flip-flops and clock gaters. In a resonant clock distribution network, clock buffers are augmented by an inductor that is used to provide additional drive strength with low energy consumption by resonating the parasitic capacitance of the load seen by the final driver that directly drives the clock inputs of the clocked elements. In general, the parasitic capacitance is associated with a single metal-only network of interconnections that connects together all the clock inputs of the set of clocked elements that are serviced by the resonant clock distribution network. The resulting combination of the buffers, inductor, and other ancillary circuitry is typically referred to as a resonant clock driver.

A canonical resonant clock driver design is also shown in FIG. 4. This driver comprises a pull-down NMOS-device final driver whose drain is connected to the clock node and whose source is connected to the ground terminal. The gate of this NMOS device is driven by a buffered and delayed copy of the reference clock signal. The arrival time of this copy of the reference clock signal to the gate of the NMOS device may be adjusted by a programmable delay element, so that certain skew requirements are met at the final arrival points of the clock signal. An inductor is connected between the clock node and a supply node whose voltage is centered at approximately the mid-point of the clock signal oscillation. For example, if the clock signal oscillates between 0V and 1V, the mid-point supply level is approximately 0.5V. To maximize energy savings, the value of the inductor is approximately chosen so that the LC tank set up by the inductor and the parasitic capacitance of the clock has a natural frequency that is approximately equal to the frequency of the reference clock signal.

The clock domain shown in FIG. 2 includes conventional clock distribution networks that propagate delayed reference clock signals to clocked elements in the device. A key issue in the design of this clock domain is to ensure that the insertion delays of the clock signals that propagate in the conventional clock distribution networks are approximately equal to the insertion delays of the clock signals that propagate in the resonant clock distribution networks. While a set of normal buffers may be needed within the resonant clock drivers to drive the gate capacitances of final drivers, the final drivers themselves are aided by the inductive elements in the resonant clock drivers, and thus, are capable of driving a relatively large capacitive load. Therefore, the buffers and final drivers in a resonant clock network tend to represent a significantly smaller set of devices than the buffers in a conventional network that drives the same load of clocked elements, leading to faster propagation of the reference clock input of the resonant clock distribution network. In addition, the resistance of the all-metal resonant clock distribution tends to be low, so that the energy efficiency of the resonant clock network is maximized, and thus the RC constant of the resonant clock network is typically very low (e.g., in the tens of picoseconds).

Consequently, overall insertion delay in the resonant clock network tends to be significantly shorter than in the conventional clock network.

A possible approach to minimizing the difference between the insertion delays in the two clock distribution networks is to use a programmable delay block that adjusts the arrival time of the reference clock signal to the resonant clock driver. Such a block may be capable of tuning the delay of the reference clock automatically, by comparing the phases of clock edges at specific points in the two clock distribution networks. Alternatively, such a block may operate in response to external control signals. Such programmable delay blocks can be quite effective in compensating for manufacturing variations. In general, their effectiveness decreases significantly in the presence of dynamic variations that occur during operation, however, such as supply voltage and temperature variations, since such variations tend to have quite short time scales (e.g., from one cycle to the other), or they tend to be localized.

Programmable delay blocks also present a number of other challenges. Due to the significant difference in the insertion delays of resonant and conventional clock distribution networks, the variation in the clock skew between the two networks due to supply voltage and temperature variations can be large. Designing programmable delay blocks that can compensate for a large range of clock skews is a challenging task. Moreover, the energy consumption and area requirements of such blocks tend to be proportional to the range of clock skews they need to support. Consequently, such blocks tend to have relatively high energy consumption and area overheads.

Figure 5:
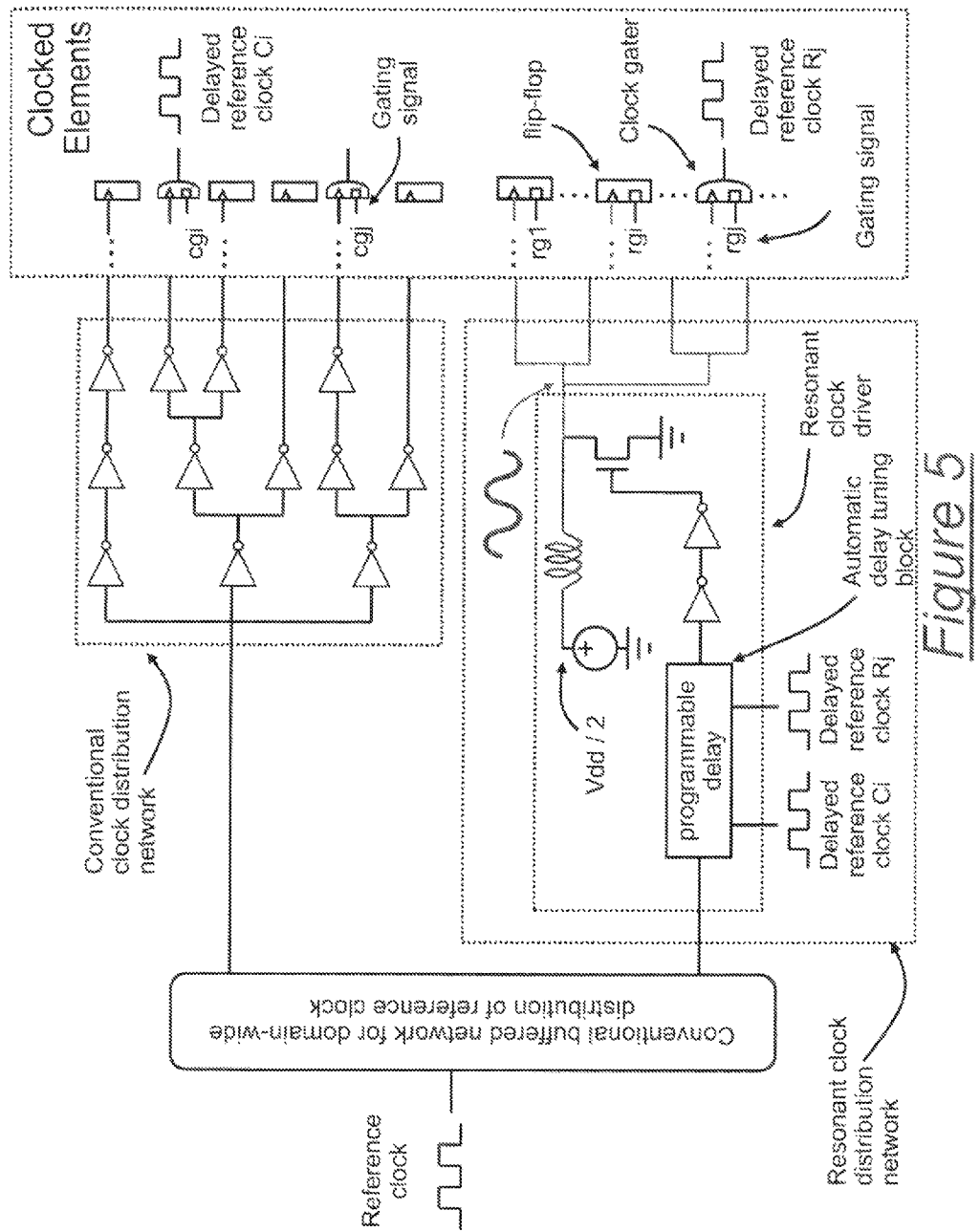
FIG. 5 shows a clock domain architecture incorporating both a resonant clock distribution network and a conventional clock distribution network

FIG. 5 gives a more detailed view of how a programmable delay block can be used to minimize the differences between the insertion delays of a resonant and a conventional clock distribution network. A representative output of a clock gater serviced by the conventional clock distribution network is used as a delayed reference clock Ci. Similarly, a representative output of a clock gater serviced by the resonant clock distribution network is used as a delayed reference clock Ri. The delayed reference clocks Ci and Ri are subsequently fed back to the programmable delay block within the resonant clock driver, which automatically adjusts the programming of the delay block so that the edges of Ci and Ri are synchronized to comply with a desired phase relationship.

While FIG. 5 shows the delayed reference clocks as the outputs of clock gaters, simple clock buffers could be substituted for the clock gaters, so long as the outputs of the buffers approximated closely the clock signals seen by the flip-flops serviced by the two distribution networks. Similarly, while the use of the programmable delay block is described in the context of matching the insertion delays of conventional and resonant clock distribution networks within a single clock domain, programmable delay blocks can also be used to match insertion delays among distribution networks in different domains, with the appropriate inter-domain sharing of delayed reference clocks.

Figure 6:
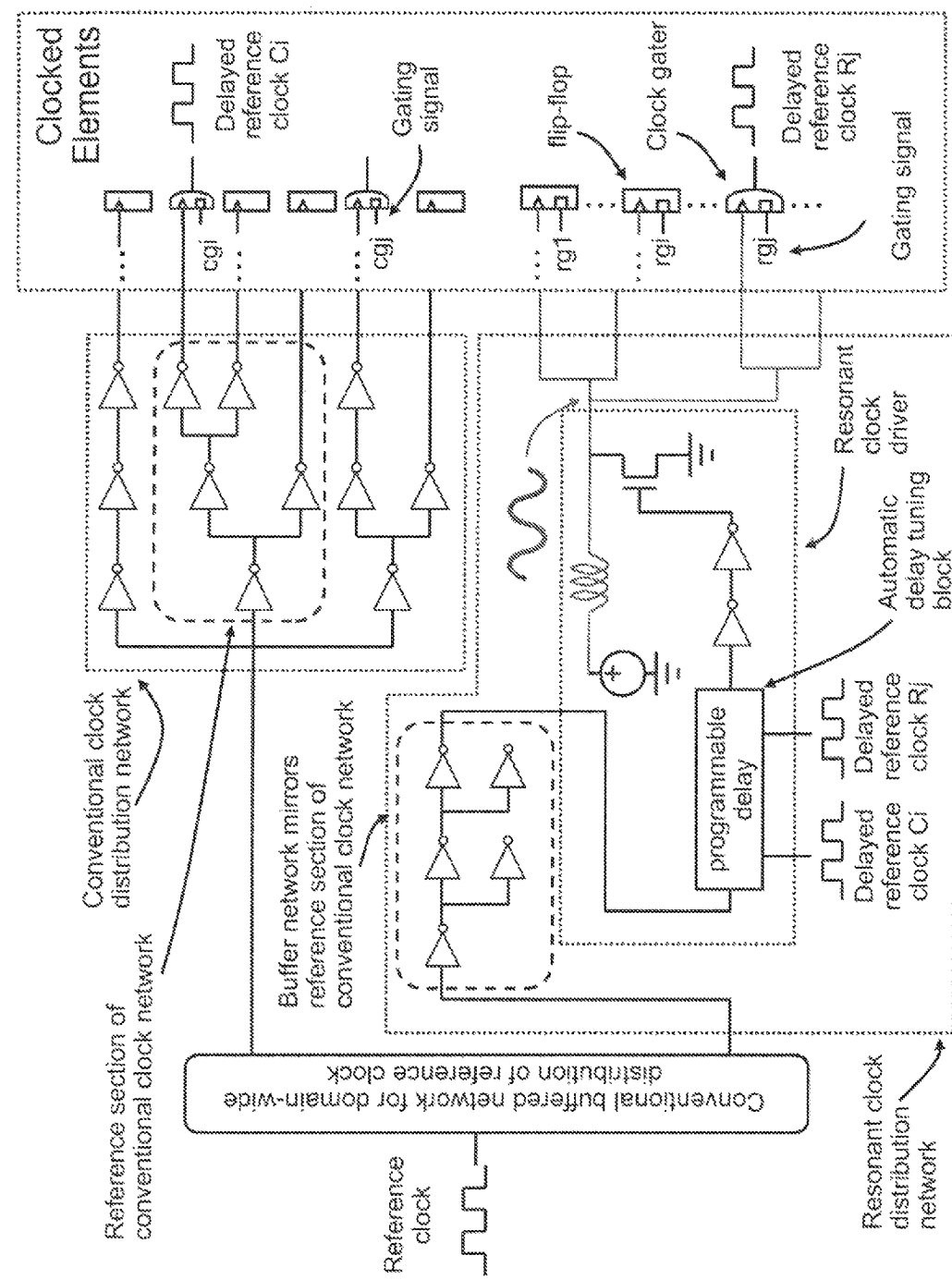
FIG. 6 shows an embodiment of a resonant clock network architecture for tracking the impact of parameter variations in a conventional clock network.

FIG. 6 shows an embodiment of an approach for designing resonant clock networks whose insertion delays can track the variation in the insertion delays of conventional clock distribution networks. In the architecture described herein, a buffer network is inserted between the clock input to the resonant clock distribution network and the clock input to the resonant clock driver to mirror the topology and loading of the conventional sub-network that distributes the clock input of the conventional clock distribution network to the clocked elements. For example, if from a clock skew standpoint the timing point of interest for the conventional clock network is output Ci of gater gi, then the inserted buffer network mirrors the so-called reference section of the conventional clock distribution sub-net that propagates the clock to gater gi. By their mirrored nature, the magnitudes and time scales of the insertion delay variation of the reference section of the conventional clock distribution network and the inserted buffer network will be comparable, resulting in lower clock skew between the two clock distribution networks, especially in the case of dynamic variations in insertion delay. Note that the inserted buffer network serves to compensate for the dynamic variation in the insertion delay of the conventional clock distribution network, and itself can be expected to have an insertion delay that is comparable to the insertion delay of the entire conventional clock distribution network. In order to compensate for the additional insertion delay of the buffers, final driver, and metal-only interconnections that are internal to the resonant clock driver, standard methods such as the programmable delay block shown may be employed.

Figure 7:
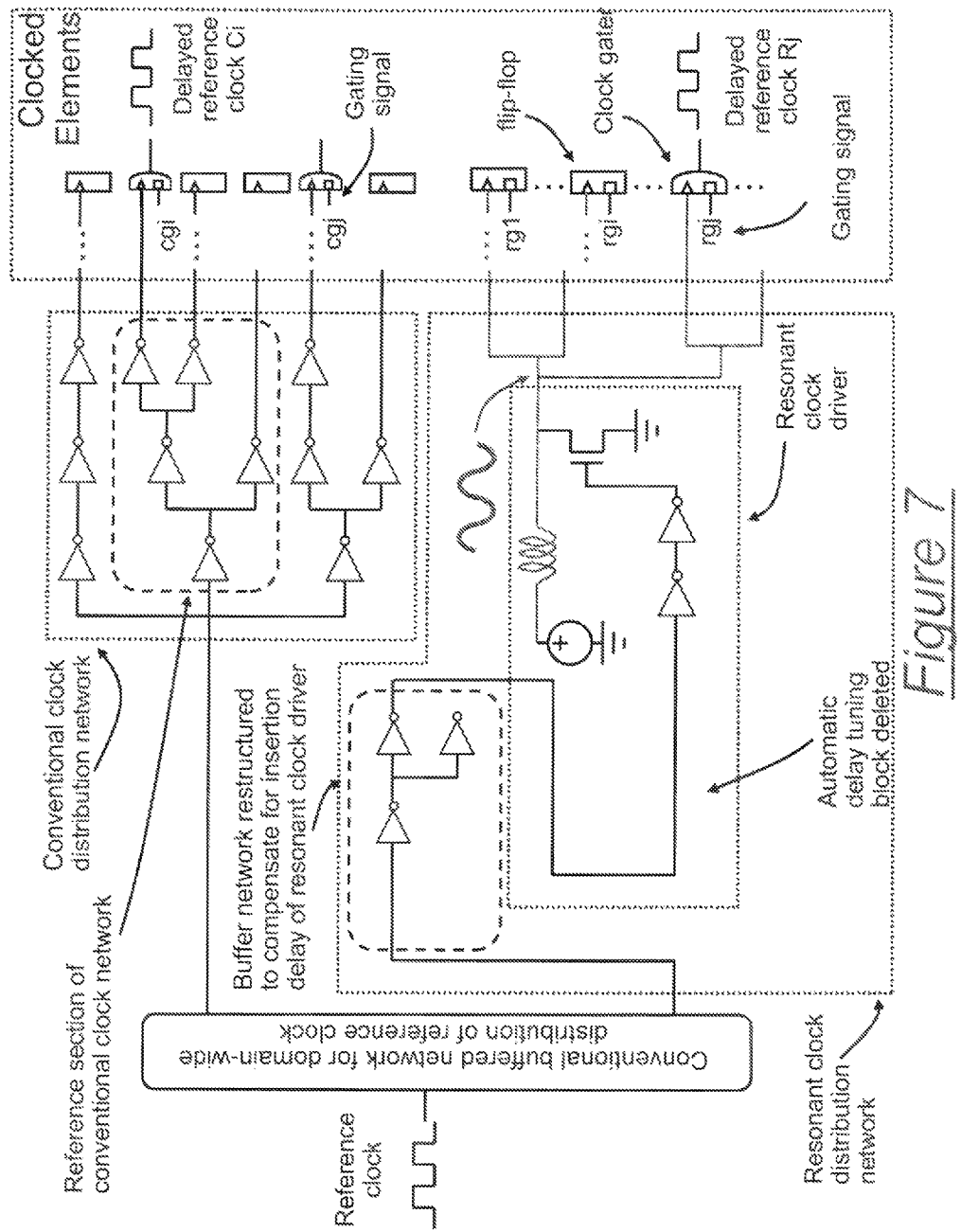
FIG. 7 shows an alternative embodiment of a resonant clock network architecture for tracking the impact of variations in a conventional clock network.

FIG. 7 shows an alternative embodiment of the resonant clock network architecture described herein. In this embodiment, the programmable delay block has been deleted. In order to prevent the delayed reference clock Rj from lagging the delayed reference clock signal Ci by the insertion delay of the buffers, final driver, and metal-only interconnections, the inserted buffer network must be restructured to have its insertion delay reduced by an equivalent amount. While the inserted buffer network will not mirror the reference section of the conventional clock network as closely as in the embodiment shown in FIG. 6, with proper structuring, compensation for dynamic variation in insertion delay can be achieved.

Figure 8:
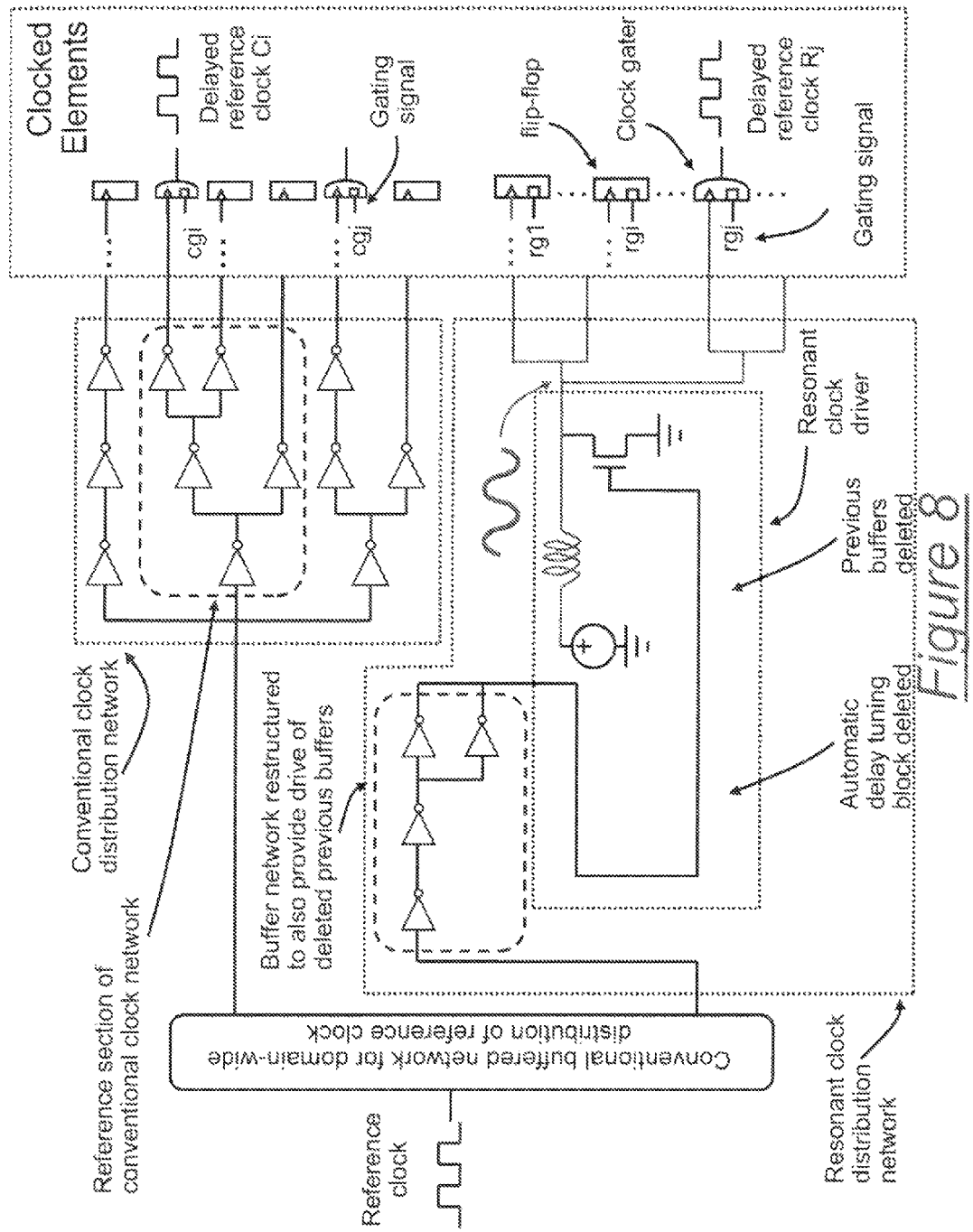
FIG. 8 shows another alternative embodiment of a resonant clock architecture for tracking the impact of variations in a conventional clock network.

FIG. 8 shows a second alternative embodiment of the resonant clock network architecture described herein. In this embodiment, the programmable delay block and the buffers internal to the resonant clock driver have been deleted. In order to be able to drive the gate input of the final driver, the inserted buffer network may have to be restructured to provide the drive that was previously provided by the deleted buffers, as well as restructured so that the total insertion delay of the inserted buffer network, the final driver and the metal-only interconnections approximates the insertion delay of the reference section of the conventional clock network. While the inserted buffer network will not mirror the reference section of the conventional clock network as closely as in the embodiment shown in FIG. 6, with proper structuring, compensation for dynamic variation in insertion delay can be achieved.

As in the programmable delay block architecture shown in FIG. 5, while FIGS. 6, 7, and 8 show the delayed reference clocks as the outputs of clock gaters, simple clock buffers could be substituted for the clock gaters, so long as the outputs of the buffers approximate closely the clock signals seen by the flip-flops serviced by the two distribution networks. Similarly, while the use of the inserted buffer networks shown in FIGS. 6, 7, and 8 is described in the context of compensating for differences in, the insertion delays of conventional and resonant clock distribution networks within a single clock domain, the inserted buffer networks can also be used to match insertion delays between distribution networks in different domains, with the appropriate inter-domain sharing of delayed reference clocks.

The architecture described herein is generally applicable to resonant clock networks that use alternative embodiments of the resonant clock driver shown in FIG. 4. Such alternative embodiments include resonant drivers in which the final drivers include both pull-up and pull-down devices, or in which the drive strengths of the final drivers can be adjusted through external control signals. They also include embodiments in which the pull-up and pull-down devices of the final drivers can be driven using difference reference clocks with different duty cycles. In other alternative embodiments, the mid-point node is implemented using one or more capacitive elements, instead of a dedicated supply. Furthermore, in other alternative embodiments, a combination of switches and/or inductive elements may be introduced to support operation of the resonant clock network at multiple frequencies either in resonant or in conventional mode. The proposed architecture is compatible with and applicable to all such alternative embodiments.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the invention.

Any patents and applications and other references noted above, including any that may be listed in accompanying filing papers, are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, sixth paragraph, will begin with the words "means for.") Accordingly, the applicant reserves the right to add additional claims after filing the application to pursue such additional claim forms for other aspects of the invention.

The invention claimed is:

1. A clock distribution network, comprising:
a conventional clock distribution network including a plurality of buffers configured to propagate a reference clock signal;
a resonant clock distribution network including a resonant clock driver having a drive element electrically coupled to a clock node of the resonant clock driver, the drive element configured to receive and propagate a clock signal, a programmable delay electrically coupled between a reference clock input and the drive element, the programmable delay of the resonant clock distribution network having one or more delayed reference clock inputs; and
a network including a plurality of buffers electrically coupled between the reference clock input and the drive element of the resonant clock driver, wherein the buffer network mirrors a topology and loading of a sub-network of the conventional clock distribution network.

2. The clock distribution network of claim 1, wherein one of the delayed reference clock inputs to the programmable delay of the resonant clock distribution network is an output of a clock gater.

3. The clock distribution network of claim 2, wherein the clock input to the clock gater is the output of one of the plurality of buffers of the conventional clock distribution network.

4. The clock distribution network of claim 2, wherein the clock input to the clock gater is the clock node of the resonant clock driver of the resonant clock distribution network.

5. The clock distribution network of claim 1, wherein one of the delayed reference clock inputs to the programmable delay of the resonant clock distribution network is the output of a buffer.

6. The clock distribution network of claim 5, wherein the input to the buffer is the output of one of the plurality of buffers of the conventional clock distribution network.

7. The clock distribution network of claim 5, wherein the input to the buffer is propagated from the clock node of the resonant clock driver of the resonant clock distribution network.

8. A clock distribution network, comprising:
a conventional clock distribution network including a plurality of buffers configured to propagate a reference clock signal;
a resonant clock distribution network including a resonant clock driver having a drive element electrically coupled to a clock node of the resonant clock driver, the drive element configured to receive and propagate a clock signal, a programmable delay electrically coupled between a reference clock input and the drive element, the programmable delay of the resonant clock distribution network having one or more delayed reference clock inputs; and a network including a plurality of buffers electrically coupled between the reference clock input and the drive element of the resonant clock driver, the network mirroring a topology and loading of a sub-network of the conventional clock distribution network, the topology of the network being modified from the topology and loading of the sub-network of the conventional clock distribution network as a function of a propagation delay of the resonant clock distribution network.

9. The clock distribution network of claim 8, wherein the modification of the topology reduces the propagation delay of the network by an amount that approximates the propagation delay of the resonant clock distribution network.

10. The clock distribution network of claim 8, wherein the modification of the topology modifies the propagation delay of the network to obtain a desired phase relationship between delayed reference clocks.

11. The clock distribution network of claim 10, wherein one of the delayed reference clocks is the output of a clock gater whose clock input is the output of one of the plurality of buffers of the conventional clock distribution network.

12. The clock distribution network of claim 10, wherein one of the delayed reference clocks is the output of a clock gater whose clock input is the clock node of the resonant clock driver of the resonant clock distribution network.

13. The clock distribution network of claim 10, wherein one of the delayed reference clocks is the output of one of the plurality of buffers of the conventional clock distribution network.

14. The clock distribution network of claim 10, wherein one of the delayed reference clocks is the output of a buffer whose input is propagated from clock node of the resonant clock driver of the resonant clock distribution network.

15. A method for achieving a desired phase relationship between a first delayed reference clock in a conventional clock distribution network including a plurality of buffers configured to propagate a reference clock signal, and a second delayed reference clock propagated from the clock node of a resonant clock distribution network including a resonant clock driver having a drive element electrically coupled to the clock node, the drive element configured to receive and propagate a clock signal, the method comprising:
electrically coupling a programmable delay between a reference clock input and the drive element, the programmable delay of the resonant clock distribution network having one or more delayed reference clock inputs; and
electrically coupling a network including a plurality of buffers between the reference clock signal and the drive element of the resonant clock driver, wherein the network mirrors a topology and loading of a sub-network of the conventional clock distribution network.

16. The method of claim 15, wherein the sub-network of the conventional clock distribution network is electrically coupled between the reference clock signal and the first delayed reference clock.

17. The method of claim 16, wherein the first delayed reference clock is a representative output of a clock gater or buffer in the conventional clock distribution network.

18. The method of claim 15, wherein the topology and/or loading of the network is modified from the topology and loading of the sub-network of the conventional clock distribution network as a function of the propagation delay of the resonant clock distribution network.

19. The method of claim 18, wherein the modification of the topology and/or loading reduces the propagation delay of the network by an amount that approximates the propagation delay of the resonant clock distribution network.

* * * * *